United States Patent [19]

Blose

[11] 4,365,688

[45] Dec. 28, 1982

[54] SPEAKER CABINET

[76] Inventor: William G. Blose, 201 Walnut St., Punxsutawney, Pa. 15767

[21] Appl. No.: 242,845

[22] Filed: Mar. 12, 1981

[51] Int. Cl.³ .............................................. H05K 5/00

[52] U.S. Cl. ..................................... 181/145; 181/146; 181/199

[58] Field of Search ............................... 181/144-147, 181/150, 151, 199; 179/1 GA, 1 E, 1 G

[56] References Cited

U.S. PATENT DOCUMENTS

| | | | |
|---|---|---|---|
| 3,648,801 | 3/1972 | Huszty et al. | 181/147 |
| 3,909,531 | 9/1975 | Plummer | 181/145 |
| 4,286,688 | 9/1981 | O'Malley | 181/199 X |

FOREIGN PATENT DOCUMENTS

| | | | |
|---|---|---|---|
| 474945 | 10/1952 | Italy | 181/144 |

*Primary Examiner*—Benjamin R. Fuller
*Attorney, Agent, or Firm*—Harvey B. Jacobson

[57] ABSTRACT

High quality stereo sound dispersion is obtained through the use of a speaker cabinet having three tiers of speakers which are effectively sound insulated from one another. The topmost and bottommost tiers have speakers which are oriented in divergent directions from one another, while the intermediate tier has speakers which are unidirectionally oriented. Horizontal sound panels are provided between the respective tiers of speakers to accomplish the sound insulating effect, and the speakers themselves are mounted in vertical panels which form walls associated with sound compartments. In this respect, the divergently oriented speakers are positioned within walls of triangularly shaped sound compartments, while the unidirectionally oriented speakers are contained within a wall of a rectangularly shaped sound compartment. The respective sound compartments are sealed airtight and are filled with acoustical fiber glass to create the desired sound enhancement characteristics. A felt material is provided as a covering over the horizontal sound panels so as to further modify the tonal effects of the projected sound.

12 Claims, 5 Drawing Figures

SPEAKER CABINET

BACKGROUND OF THE INVENTION

1. Field of the Invention

The present invention relates to acoustic systems utilizing stereo speakers and more particularly pertains to a uniquely constructed stereo speaker cabinet which provides for sound insulating a plurality of speaker tiers from one another, such speakers being oriented in different directions and being associated with airtight sound chambers filled with acoustical fiber glass forming three independent acoustic suspension systems.

2. Description of the Prior Art

The prior art reveals evidence of many attempts to develop stereo speaker cabinets which efficiently disperse sound generated from stereo speakers. Such cabinets have utilized various types of enclosures, baffles, cabinets, horns, and the like, so as to produce a satisfactory response throughout the audible frequency range. For example, U.S. Pat. No. 2,694,462, issued Nov. 16, 1954, to Robbins et al, discloses a pair of orthogonally aligned speakers mounted in a speaker cabinet, such speakers being positioned within individual airtight chambers. The respective sound chambers are effectively sealed from one another through the use of a partition constructed as a part of the speaker cabinet. However, sound chambers constructed in this manner, i.e., having only air contained therein, usually present problems wherein at low frequencies, there is great difficulty in achieving adequate coupling between the moving diaphragms of the speakers and the air contained within the chambers so as to develop sound pressures that are comparable to the efficiency of the speakers at higher frequencies. Due to the fact that low frequency energy values in acoustics are quite large and, therefore, require greater movement of air than do higher frequencies, and further due to the fact that air is quite compressible, sound chambers constructed in the manner of the Robbins et al device have generally been inefficient in producing desired tonal effects frequently resulting in unnatural and sometimes annoying sound distribution. As such, those concerned with the development of acoustic systems have long recognized the need for speaker cabinet designs which effectively filter and dampen sounds which are in frequency ranges that are annoying to listeners. The construction of the present invention overcomes these problems.

SUMMARY OF THE INVENTION

The general purpose of the present invention, which will be described subsequently in greater detail, is to provide a stereo speaker cabinet having an arrangement of stereo speakers therein which has all the advantages of similarly employed speaker cabinets and has none of the above described disadvantages. To attain this, the present invention provides for a plurality of speakers mounted in tiers within a speaker cabinet. In this connection, three tiers of speakers are provided, the topmost and bottommost of which have speakers divergently directed at 90° angles from one another, while the intermediate tier has a plurality of speakers unidirectionally aligned. The respective tiers of speakers are sound insulated from one another through the use of horizontally positioned sound panels which are covered with a felt material, and the speakers per se are positioned within airtight sound chambers which effectively serve to amplify the sound produced. The sound chambers associated with the topmost and bottommost tiers of divergently aligned speakers are of a triangular shape, while the sound chamber associated with the unidirectionally aligned speakers contained in the intermediate tier is of a rectangular shape. An effective control of air pressure within the respective sound chambers, which serves to dampen and remove annoying low and high frequency sounds, is obtained through the filling of each of the sound chambers with acoustical fiber glass. A further control of annoying frequency ranges is achieved through the use of the aforedescribed horizontal sound panels between the respective tiers of speakers, as well as through the alignment of speakers in adjacent tiers in non-aligned sound projection directions.

It is, therefore, an object of the present invention to provide a stereo speaker cabinet which has all of the advantages and none of the disadvantages of speaker cabinets utilized in the prior art.

It is another object of the present invention to provide a stereo speaker cabinet which may be easily and economically manufactured.

It is a further object of the present invention to provide a stereo acoustic system which effectively dampens or removes annoying low and high frequency sounds.

It is yet another object of the present invention to provide a novel arrangement of stereo speakers which effectively reduces sound interference therebetween by means of providing three independent acoustic suspension systems for each speaker group of the stereo set.

Even another object of the present invention is to provide for a new and improved sound chamber construction utilizable with stereo speakers.

A still further object of the present invention is to provide sound insulating means between respective tiers of stereo speakers.

These together with other objects and advantages which will become subsequently apparent reside in the details of construction and operation as more fully hereinafter described and claimed, reference being had to the accompanying drawings forming a part herein, wherein like numerals refer to like parts throughout.

DESCRIPTION OF THE PREFERRED EMBODIMENT

Figure 1:
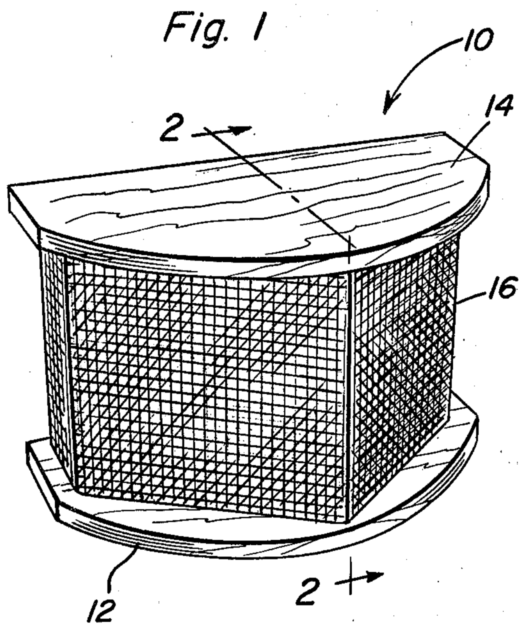
FIG. 1 is a perspective view of the completely assembled stereo speaker cabinet comprising the present invention.

Reference is now made to the drawings and, in particular, to FIG. 1 wherein there is illustrated a preferred embodiment of the stereo speaker cabinet forming the present invention and as generally designated by the numeral 10. In this respect, the cabinet 10 includes a floor-engaging portion or base 12 and a cover portion or top member 14, such top member being parallelly aligned with and spaced apart from the base. The specific structure which houses the speakers within the speaker cabinet 10 is hidden from view in FIG. 1 by a decorative covering 16 provided thereon and intended for that very purpose.

Figure 2:
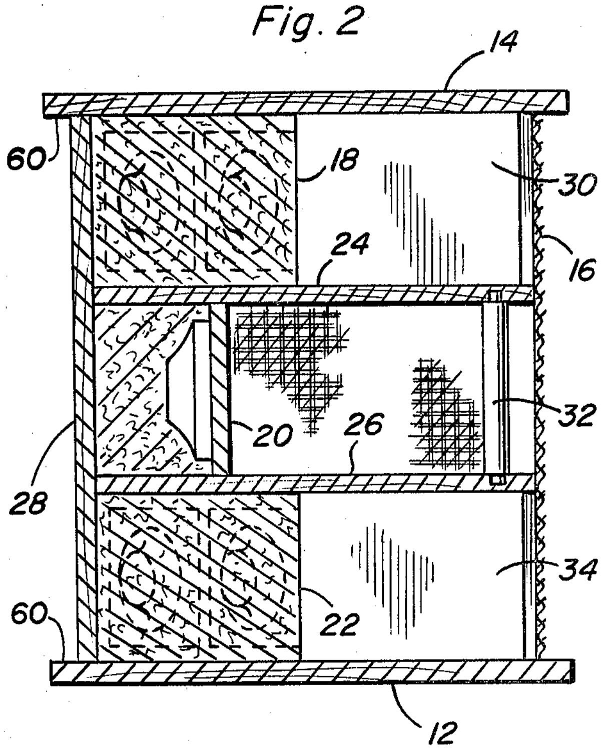
FIG. 2 is a transverse cross-sectional view taken along the line 2—2 of FIG. 1.

FIG. 2 partially illustrates some of the internal construction of the stereo speaker cabinet 10. In this regard, there is illustrated a topmost or first tier 18 of stereo speakers mounted between the first sound panel or top member 14 and a second sound panel 24, an intermediate or second tier 20 of speakers mounted between the second sound panel and a third sound panel 26, and a bottommost or third tier 22 of speakers mounted between the third sound panel and a fourth sound panel or base 12. Further illustrated in FIG. 2 is a sound-insulating back wall member 28 which is vertically positioned between and attached to the horizontally aligned base 12 and top member 14. The back wall member 28 provides support for the top member 14, as well as serving to define a wall portion of sound chambers which will be subsequently described and which are associated with the respective tiers 18, 20, 22 of stereo speakers.

Further support for the top member 14 is provided through the use of a first supporting and sound insulating partition 30 fixedly attached to and positioned between the top member and the second sound panel 24, a support dowel 32 positioned between and fixedly attached to the second sound panel and the third sound panel 26, and a second supporting and sound insulating partition 34 positioned between and fixedly attached to the third sound panel and the base 12.

Figure 3:
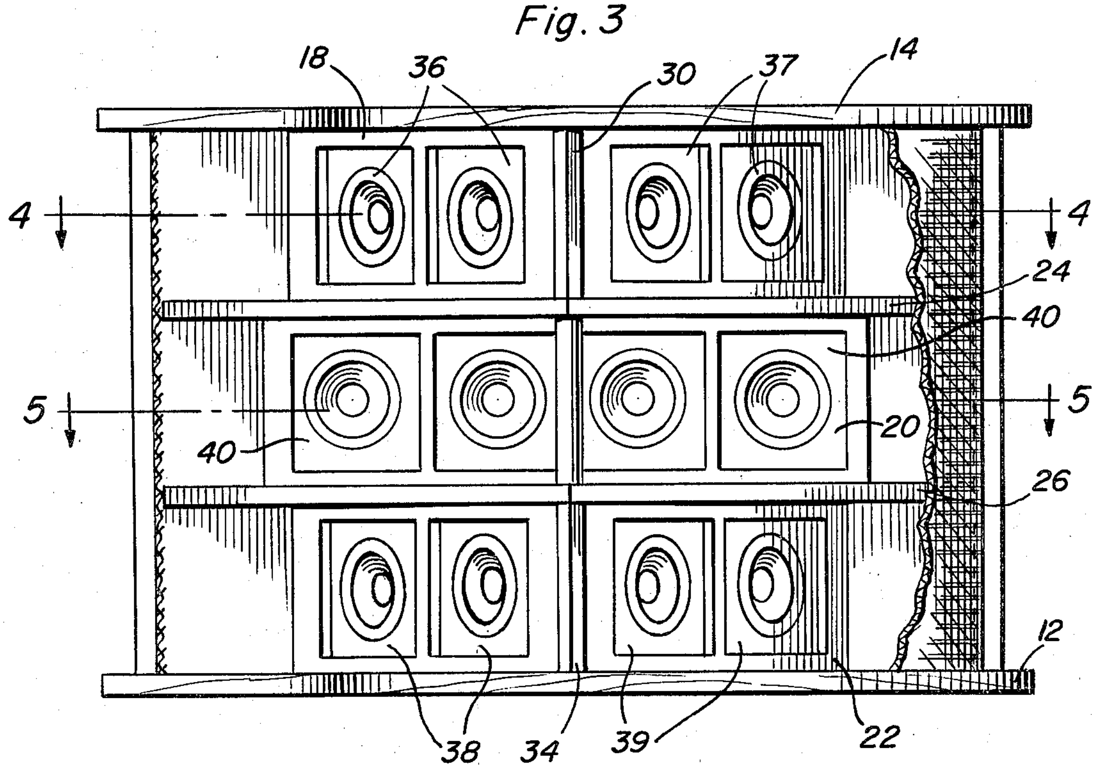
FIG. 3 is a front elevation view of the present invention wherein a portion of the front covering is broken away to illustrate the positioning of stereo speakers therein.

Referring now to FIG. 3 of the drawings, it can be seen that the first tier of speakers 18 includes a pair of right side speakers 36 and a pair of left side speakers 37, the right side and left side pairs of speakers being on respective sides of the first support partition 30. Similarly, the third tier of speakers 22 includes a pair of right side speakers 38 and a pair of left side speakers 39, these pairs of speakers being disposed on opposite sides of the second support partition 34. Each speaker within the respective speaker pairs 36, 37, 38, 39 is parallelly aligned with the other speaker, while the speaker pairs 36, 38 are parallelly aligned with each other, as are the speaker pairs 37 and 39. By the same token, the speaker pair 36 is orthogonally aligned with the speaker pair 37, and the speaker pair 38 is orthogonally aligned with the speaker pair 39. As such, it can be appreciated that the pairs of speakers 36, 38 are so aligned as to disperse sound in the same direction, while the speaker pairs 37, 39 are similarly aligned. Further, the speaker pairs 36, 37 are separated from the speaker pairs 38, 39 by the space defined by the intermediate tier of speakers 20.

Also to be ascertained with reference to FIG. 3 is the fact that the intermediate or second tier of speakers 20 utilizes four individual speakers 40, all of these speakers being parallelly aligned in a side-by-side relationship thereby to disperse sound unidirectionally with respect to each other, but divergently with respect to the speaker pairs 36, 37, 38, 39.

Figure 4:
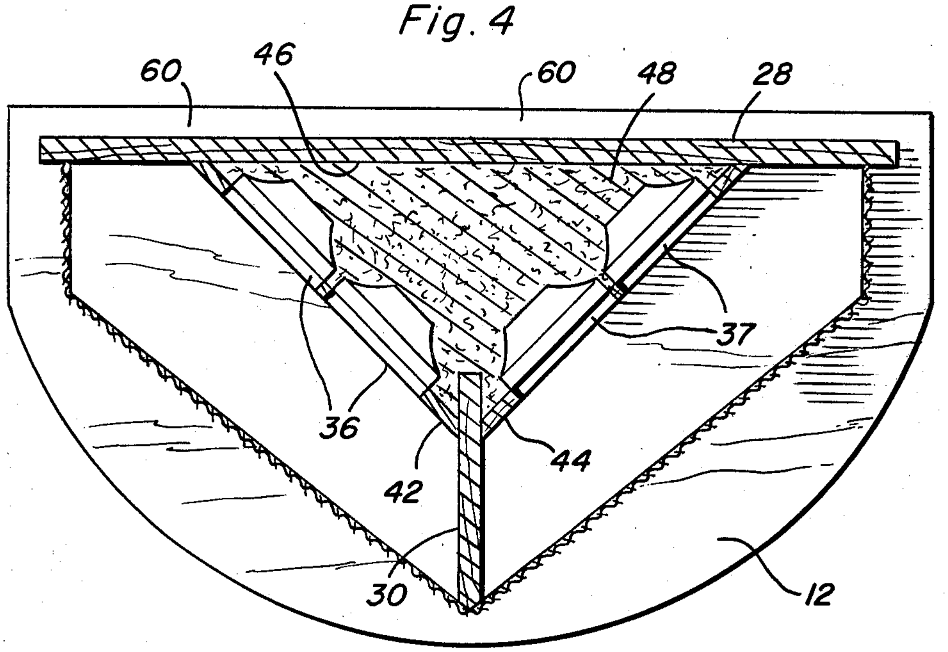
FIG. 4 is a top cross-sectional view taken along the line 4—4 of FIG. 3.

To understand the specific structure of the first and third tiers of speakers 18, 22, reference is made to FIG. 4 of the drawings which illustrates a cross-sectional view of the speaker tier 18, such tier being identical in construction to the speaker tier 22. In this regard, it can be seen that the pair of speakers 36 are, as aforedescribed, orthogonally positioned with respect to the pair of speakers 37. The pair of speakers 36 are shown mounted in a wall member 42, and the pair of speakers 37 are similarly mounted in a wall member 44. The wall members 42, 44 are respectively sealingly attached to the back wall member 28 and to the first support partition 30 and, as is apparent with reference to FIGS. 3 and 4 simultaneously, the wall members 42, 44, the top member 14 and the second sound panel 24 all serve to define an enclosed triangular space or first sound chamber 46 which is of an airtight construction and which is preferably filled with an acoustical fiber glass 48. The airtight construction of the sound chamber 46 is completed by sealingly positioning the respective pairs of speakers 36, 37 therein.

Figure 5:
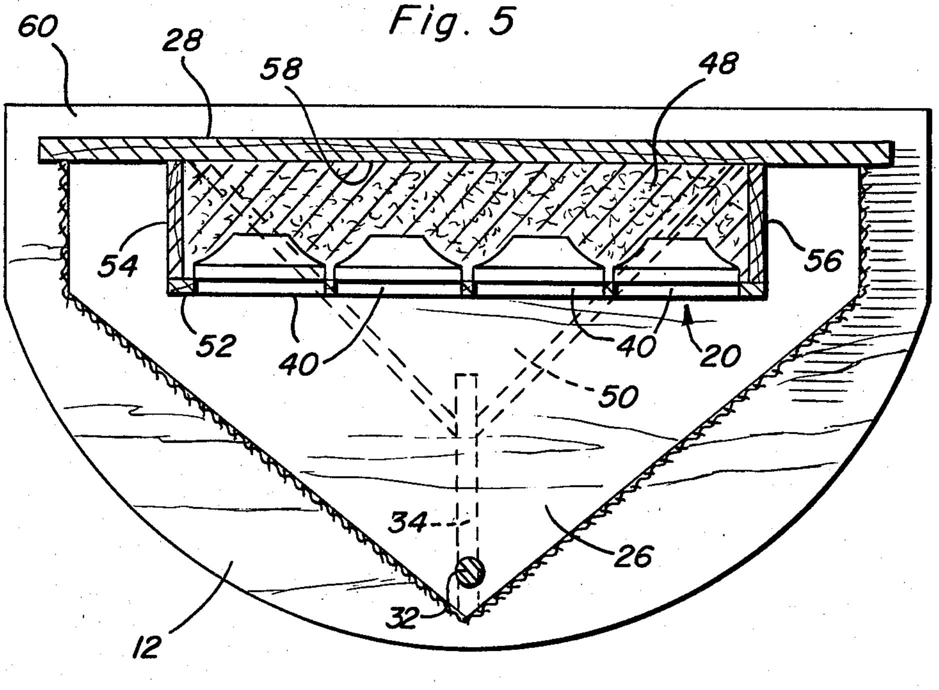
FIG. 5 is a top cross-sectional view taken along the line 5—5 of FIG. 3.

Of course, it is to be understood that the third tier of speakers 22 is of an identical construction to the first tier of speakers 18 so that a second triangularly shaped sound chamber 50 is formed, such chamber being of an airtight construction and being partially illustrated by broken lines in FIG. 5. Contrary to the construction of the first and third tiers of speakers 18, 22, the second or intermediate tier of speakers 20 utilizes the aforementioned speakers 40 in a manner whereby they are sealingly positioned within a wall member 52. The wall member 52 is parallelly aligned with and spaced apart from the back wall member 28, and is attached thereto by a pair of side wall members 54, 56. As such and with reference to FIG. 3 concurrently with the construction of FIG. 5, it can be seen that a rectangularly shaped sound chamber 58 is defined by the back wall member 28, the wall member 52, the side wall members 54, 56, the second sound panel 24 and the third sound panel 26. The intermediate sound chamber 58 is also of an airtight construction and is filled with acoustical fiber glass 48. Use of the dowel support 32 between the first and second sound panels 24, 26 is desirable so as to present minimal interference with the sound dispersion pattern emanating from the four speakers 40. With the same concept in mind, the first and second support partitions 30, 34 are purposedly constructed of a solid, sound insulating material so that an effective blocking of the sound generated by the pairs of speakers on the respective tiers can be achieved, i.e., it is desirable to prevent interference of the sound generated by speaker pairs 36 with the sound generated by the speaker pairs 37 in the first tier of speakers 18, and similarly to prevent interference between the sound generated by speakers 38 with speakers 39 positioned within tier 22. This construction permits a divergent dispersion of sound from the first and third speaker tiers 18, 22 and a unidirectional dispersion of sound from the second speaker tier 20.

To present an additional shield against sound interference between the respective speaker tiers 18, 20, 22, the individual sound panels 24, 26 are constructed of a sound insulating material and are further covered with a cloth-like material, such as felt 16, which conveniently serves to dampen out certain annoying frequencies. As such, the respective tiers of speakers 18, 20, 22 are substantially sound insulated from one another.

As can also be ascertained with reference to FIGS. 4 and 5, the back wall member 28 is attached to the base 12 in a recessed manner from an edge thereof so as to define a lip portion 60 on the base. This specific construction prevents the back wall member 28 from coming into contact with other structure, such as the wall of a house, since the lip portion 60 effectively serves to limit the distance between the back wall member and some surrounding structure. Effectively, some of the desirable characteristics associated with utilizing the respective sound chambers 46, 58, 50 would be lost if the back wall member 28 were to be in contact with other structure, since the other structure would tend to dampen out some of the desirable vibratory movement of the back wall member which is required to produce effective audio dispersion.

In effect, the stereo speaker cabinet 10 of the present invention effectively controls sound characteristics, such as tonal quality, sound direction and intensity, through the use of several specific and novel design features. In this regard, it is noted that the preferred embodiment has been described as comprising three completely separate groups of four speakers, each group being housed in a separate sound compartment. Each of the three compartments have been described as being individually packed with acoustical fiber glass and being separately sealed airtight. Further, each separately packed and sealed compartment acts as an individual sound producing unit, while two of the compartments are directed at a 45° angle from the back of the stereo speaker cabinet and are identical in size. These two compartments utilize vertical sound panels so as to direct sound in two directions while the third compartment directs the sound in only one direction. However, it is to be understood that the preferred embodiment as above described may be varied somewhat in construction without departing from the scope and intent of the invention.

Also noteworthy with respect to the above described invention is the fact that the four horizontal sound panels may be varied in number depending on the number of tiers of speakers utilized. Further, the three sound compartments have been illustrated as being recessed from an outer edge of the topmost and bottommost horizontal sound panels to thereby provide for the creation of a slight megaphone effect which enables the system to create a greater intensity of sound at lower volume levels. The felt material covering the respective horizontal sound panels serves to eliminate the sharp sound that usually accompanies any megaphone effect. As such, the above description presents only a generalized construction of the present invention and it should be realized that optimum dimensional relationships for the parts of the invention are deemed readily apparent and obvious to one skilled in the art, and all equivalent relationships to those illustrated in the drawings and described in the specification are intended to be emcompassed by the present invention.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as new is as follows:

1. An acoustic system comprising:

a speaker support means having a plurality of tiers forming airtight spaces containing a plurality of sound dispersing speakers positioned within said speaker support means, a topmost tier of said speakers and a bottommost tier of said speakers each utilizing speakers divergently aligned with one another;

sound chamber means associated with said airtight spaces of said plurality of sound dispersing speakers, said sound chamber means serving to modify the tonal quality of sound emitted by said plurality of speakers;

sound obstructing means including material covering means performing as a sound insulation means associated with said support means and forming sound panel means positioned between adjacent tiers of said plurality of tiers serving to selectively prevent an interference of dispersed sound between said plurality of speakers; and sound directing means serving to direct said dispersed sound in a desired direction.

2. The acoustic system as described in claim 1, wherein said plurality of tiers includes at least three tiers, said at least three tiers being sound insulated from one another by said sound obstructing means.

3. The acoustic system as described in claim 1, wherein four speakers are provided in each of said plurality of tiers of speakers.

4. The acoustic system as described in claim 1, wherein an intermediate tier of speakers has four speakers unidirectionally aligned.

5. The acoustic system as described in claim 1, wherein said sound directing means includes wall members into which said plurality of speakers are fixedly mounted, said wall members being positioned so as to cause an alignment of said plurality of speakers in a desired direction.

6. The acoustic system as described in claim 4, wherein said sound chamber means associated with said topmost and bottommost divergently aligned tiers of speakers are of a triangular shape and said sound chamber means associated with said intermediate unidirectionally aligned speakers is of a rectangular shape.

7. The acoustic system as described in claim 1, wherein said sound chamber means are packed with acoustical fiber glass.

8. A stereo speaker support means in a cabinet comprising:

a base member, said base member comprising a sound insulating horizontal panel;

a top member, said top member comprising a horizontal sound panel;

a back wall member, said back wall member serving to connect said base member with said top member;

a first sound panel horizontally aligned with and positioned between said top member and said base member;

a second sound panel horizontally aligned with and positioned between said top member and said base member;

a first group of stereo speakers positioned between said top member and said first sound panel, said first group of stereo speakers being divergently aligned with respect to one another;

a second group of stereo speakers positioned between said first sound panel and said second sound panel, said second group of stereo speakers being unidirectionally aligned; and a third group of stereo speakers positioned between said second sound panel and said base member, said third group of stereo speakers being divergently aligned with respect to one another;

said first and third groups of stereo speakers being sealingly mounted in airtight triangularly shaped sound chamber means each packed with acoustical fiber glass and said second group of stereo speakers sealingly mounted in a rectangularly shaped airtight sound chamber means packed with acoustical fiber glass;

said first and third groups of stereo speakers each including at least a first pair of parallelly aligned speakers which are orthogonally aligned with at least a second pair of parallelly aligned speakers;

said first and second pairs of aligned speakers being positioned outwardly from said triangularly shaped sound chamber means and having vertically positioned sound insulating panels respectively disposed between said top member and said first sound panel and between said second sound panel and said base member;

said second group of speakers including at least four unidirectionally aligned speakers, said second group of speakers being divergently aligned with respect to said first and third groups of speakers.

9. The stereo speaker cabinet as described in claim 8, wherein felt material is utilized to cover said top member, said first sound panel, said second sound panel, and said base member.

10. The stereo speaker cabinet as described in claims 1 or 8 wherein the speakers are dimensioned as equal sized speaker elements.

11. The stereo speaker cabinet as described in claims 1 or 8 wherein a lip portion extends rearwardly of the speaker support means for preventing it from coming into contact with other structures, the lip portion effectively serving to limit the distance between the cabinet and other structures.

12. The invention of claims 1 or 8 wherein the chamber means are each of comparable volumes.

* * * * *